United States Patent
Liu et al.

(10) Patent No.: US 6,898,081 B2
(45) Date of Patent: May 24, 2005

(54) RADIATOR STRUCTURE FOR A COMPUTER DEVICE

(75) Inventors: Wen-Chin Liu, Taipei (TW); Yi-Lung Chou, Taipei (TW)

(73) Assignee: Tarung Co., Ltd., Taipei (TW)

( * ) Notice: Subject to any disclaimer, the term of this patent is extended or adjusted under 35 U.S.C. 154(b) by 34 days.

(21) Appl. No.: 10/689,065

(22) Filed: Oct. 21, 2003

(65) Prior Publication Data

US 2004/0240176 A1 Dec. 2, 2004

(30) Foreign Application Priority Data

Jun. 2, 2003 (TW) .................................... 92210124 U

(51) Int. Cl.[7] .................................................. G06F 1/20
(52) U.S. Cl. .................... 361/687; 361/689; 361/704; 257/706; 174/15.1
(58) Field of Search ................................ 361/679–687, 361/724–727, 719, 722; 257/706–707, 712–713, 718–719, 726–727; 165/80.2, 80.3; 174/15.1, 15.2

(56) References Cited

U.S. PATENT DOCUMENTS 6,396,699 B1 * 5/2002 Caldwell et al. ............ 361/704
6,735,077 B2 * 5/2004 Yamazaki et al. .......... 361/689
6,836,408 B2 * 12/2004 Gektin et al. ............... 361/704

* cited by examiner

Primary Examiner—Hung Van Duong
(74) Attorney, Agent, or Firm—Bacon & Thoma PLLC

(57) ABSTRACT

A radiator structure has a circuit board, at least one conductive plate, a radiator board and at least two lock attachments, and reduces the entire radiator structure size to permit micro miniaturization designs and increase the space efficiency without affecting cooling efficiency. The radiator board has a deforming section, which undergoes resilience deformation facing the circuit board to absorb a contact pressure generated between the radiator board, the conductive plate and the microprocessor chip. Use of a spring to absorb the contact pressure is thus not required, which decreases the number of parts and manufacturing costs.

6 Claims, 5 Drawing Sheets

RADIATOR STRUCTURE FOR A COMPUTER DEVICE

BACKGROUND OF THE INVENTION

1. Field of the Invention

The present invention relates to a radiator structure and, more particularly, to a radiator structure that is suitable for a desktop computer, a notebook computer, a plate computer, and similar computer devices, and which is especially suited for a blade server.

2. Description of Related Art

In a computer device, such as a desktop computer, a notebook computer, a plate computer or a blade server, cooling is always a significant concern for research and design engineers, as the most recent microprocessor chips used in these computer devices have higher and higher clock speeds, which lead to the generation of more and more heat. This generated heat needs to be radiated, as it will otherwise cause the computer device to shut down.

The prior art cooling method utilizes a cooling fin. Please refer to FIG. 1. FIG. 1 is an exploded view of a prior art cooling structure. A cooling fin 91 is adhered to an exothermnal chip 94 of a circuit board 93 by way of a cooling glue layer 92, and fixed on the circuit board 93 by way of a plurality of screws 95. However, the prior art cooling fin 91 takes up too much space, and thus does not permit micro miniaturization designs. Taking a blade server as an example, several server blades are contained in a fixed size case; if the size of the cooling structure can be reduced, the blade server will be able to accommodate a greater number of server blades.

Furthermore, the prior art cooling fin 91 is fixed on the circuit board 93 using the plurality of screws 95, and is pressed close to the exothermal chip 94. However, all common exothermal chips 94 have an acceptable contact pressure value, and the cooling fin 91 cannot impart a pressure that exceeds the acceptable contact pressure value of the exothermal chip 94. In order to control different applied pressures for different exothermal chips 94, the plurality of screws 95 need to be used with a special spring 96. Once the plurality of screws 95 is fastened, the spring 96 absorbs the contact pressure caused by the plurality of screws 95. Consequently, different exothermal chips 94 require different springs 96 with different design characteristics, which increases the total number of fixing parts for the cooling fin 91, and also increases the manufacturing costs.

SUMMARY OF THE INVENTION

A main objective of the present invention is to provide a radiator structure, which can reduce the size of the radiator structure to permit micro miniaturization designs and increase space usability.

Another objective of the present invention is to provide a radiator structure, which absorbs contact pressure by way of resilience of a radiator board to decrease the number of parts and manufacturing costs.

In order to achieve the above-mentioned objectives, the radiator structure of the present invention is disposed in a computer device. The radiator structure has a circuit board, at least one conductive plate, a radiator board and at least two lock attachments. The circuit board includes at least one exothermal unit installed thereon and at least two apertures. Wherein the at least two apertures being spaced at a predetermined distances from the at least one exothermal unit. The at least one conductive plate is placed above the at least one exothermal unit of the circuit board.

The radiator board has at least two lock structures corresponding to the at least two apertures of the circuit board. Each lock structure includes a deforming section and two long slots. Wherein the deforming section is formed between the two long slots, and a lock seat is placed on the deforming section.

Furthermore, the at least two lock attachments are respectively disposed through the at least two apertures of the circuit board and lock onto the lock seat of the radiator board, so that the radiator board is pressed close onto the at least one conductive plate and the at least one exothermal unit. A locking force from the lock seat of the radiator board resiliently deforms the deforming section facing the circuit board to absorb a contact pressure generated between the radiator board, the at least one conductive plate and the at least one exothermal unit.

In the present invention, the radiator board replaces the prior art cooling fin, and requires less space without reducing cooling efficiency. Micro miniaturization designs can thus be achieved, and the space efficiency is increased. Moreover, the deforming section of the radiator board provides an resilient force to absorb a contact pressure generated between the radiator board, the conductive plate and the exothermal unit, so that the present invention does not need springs, which reduces both the total number of parts and the manufacturing costs of the entire radiator structure.

The conductive plate can be a copper plate, and is adhered to the exothermal unit of the circuit board by a cooling glue layer. The exothermal unit is a microprocessor chip. Furthermore, the radiator board is a metal board with a high thermal conductivity coefficient, such as an aluminum alloy board.

Other objectives, advantages, and novel features of the invention will become more apparent from the following detailed description when taken in conjunction with the accompanying drawings.

DETAILED DESCRIPTION OF THE PREFERRED EMBODIMENT

Figure 2:
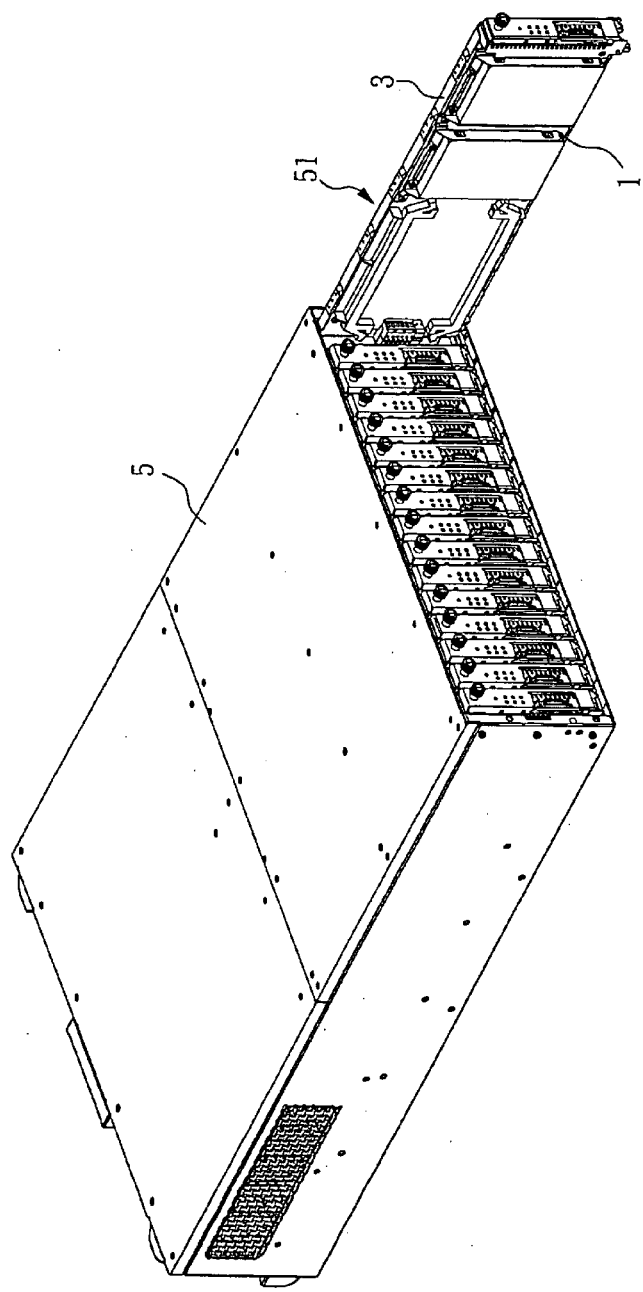
FIG. 2 is a schematic drawing of the present invention used in a blade server.

Please refer to FIG. 2. FIG. 2 is a schematic drawing of the present invention used in a blade server. A blade server 5 (a computer device) has a plurality of server blades 51. A radiator structure of the present invention is placed on each server blades 51.

Figure 3:
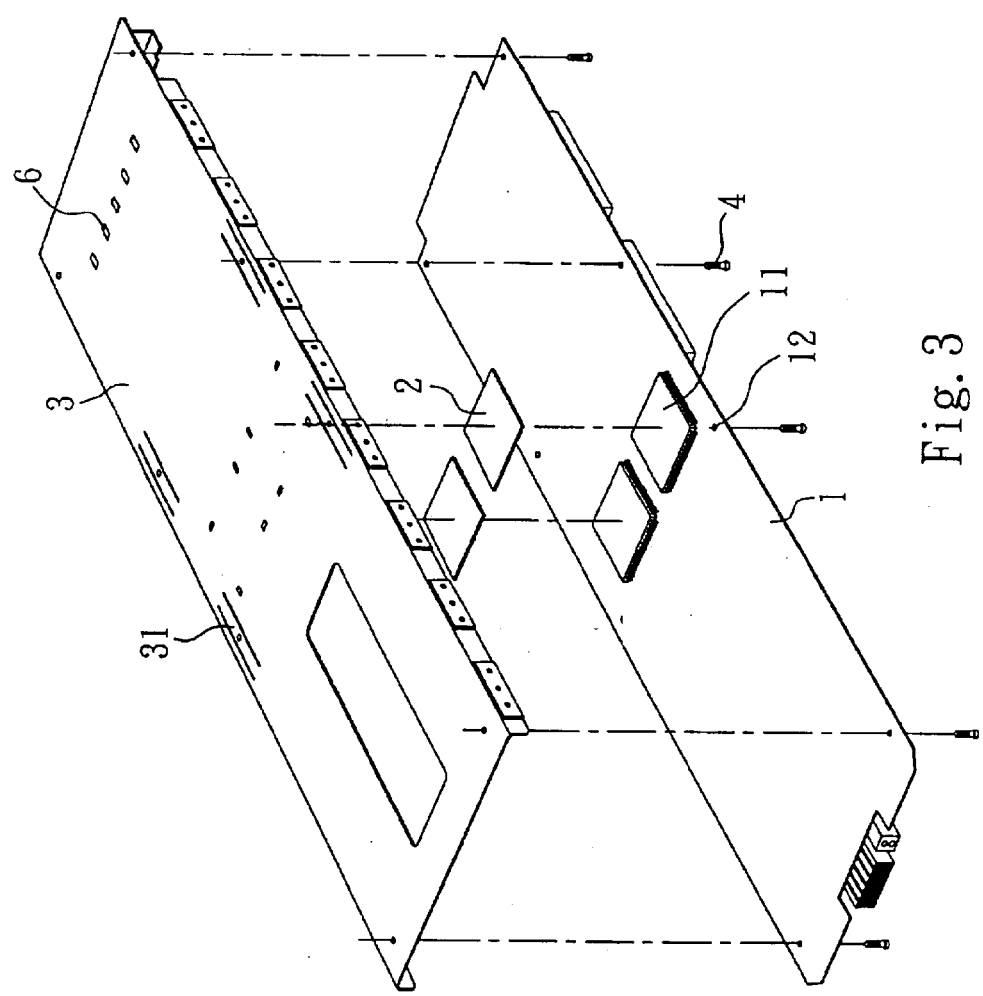
FIG. 3 is an exploded view of the present invention.
Figure 4:
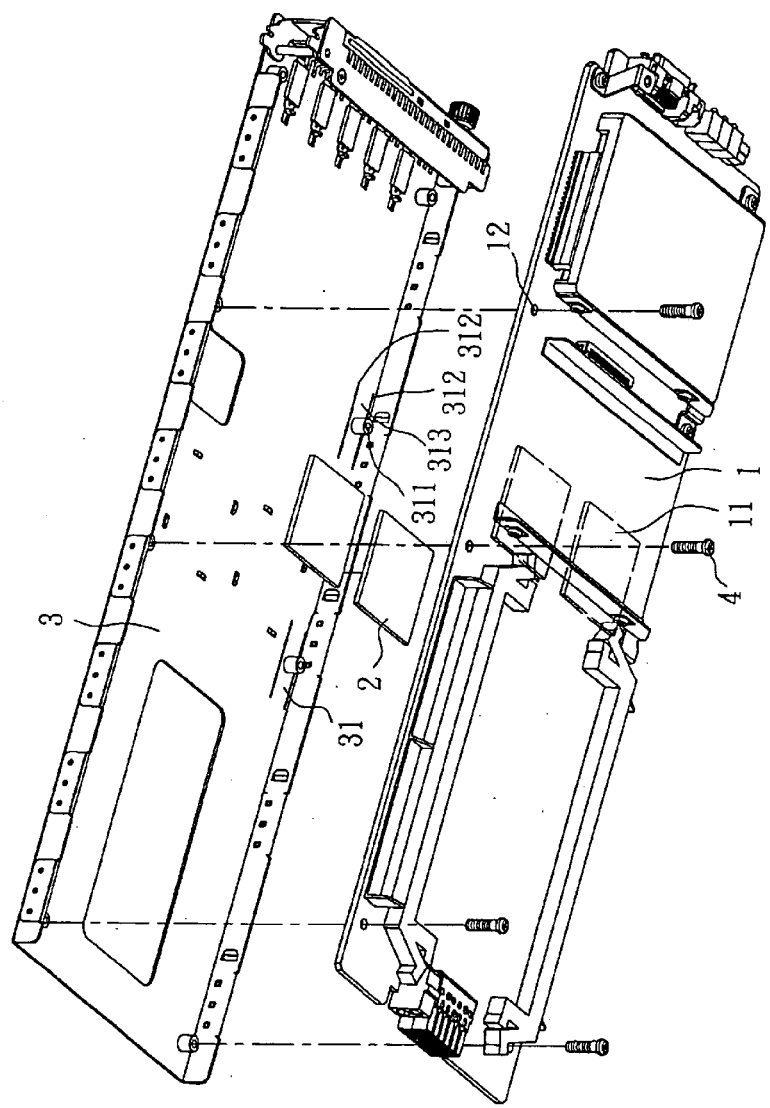
FIG. 4 is another exploded view of the present invention.
Figure 5:
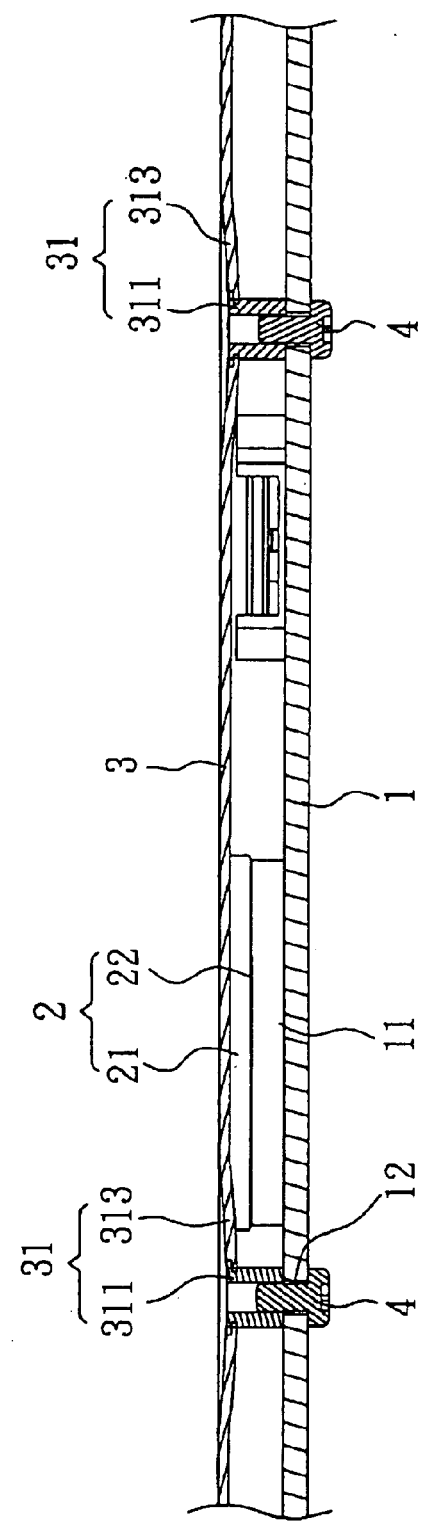
FIG. 5 is a sectional drawing of the present invention when locked.

Please FIG. 3, FIG. 4 and FIG. 5. FIG. 3 is an exploded view of the present invention. FIG. 4 is another exploded view of the present invention. FIG. 5 is a sectional drawing of the present invention when locked. In the drawings, one of the server blade 51 is taken out and decomposed. The radiator structure comprises a circuit board 1, two conductive plates 2, a radiator board 3 and four screws 4 (lock attachments). The circuit board 1 further comprises two microprocessor chips 11 (exothermal units) installed thereon and four apertures 12. Each microprocessor chip 11 generates differing amounts of heat. Each aperture 12 is spaced at a predetermined distance from the two microprocessor chips 11, and two conductive plates 2 are respectively placed above the two microprocessor chips 11 of the circuit board 1. In this embodiment, the two conductive plates 2 are copper plates and respectively adhered onto the two microprocessor chips 11 of the circuit board 1 by way of a cooling glue layer 22.

The radiator board 3 has four lock structures 31. Each lock structure 31 respectively corresponds to one aperture 12 of the circuit board 1, and each lock structure 31 further has a deforming section 313 and two long slots 312. The deforming section 313 is formed between two long slots 312. A tapped hole seat (a lock seat) 311 is placed on the deforming section 313. In this embodiment, the radiator board 3 is an aluminum alloy board with a high thermal conductivity coefficient.

Figure 1:
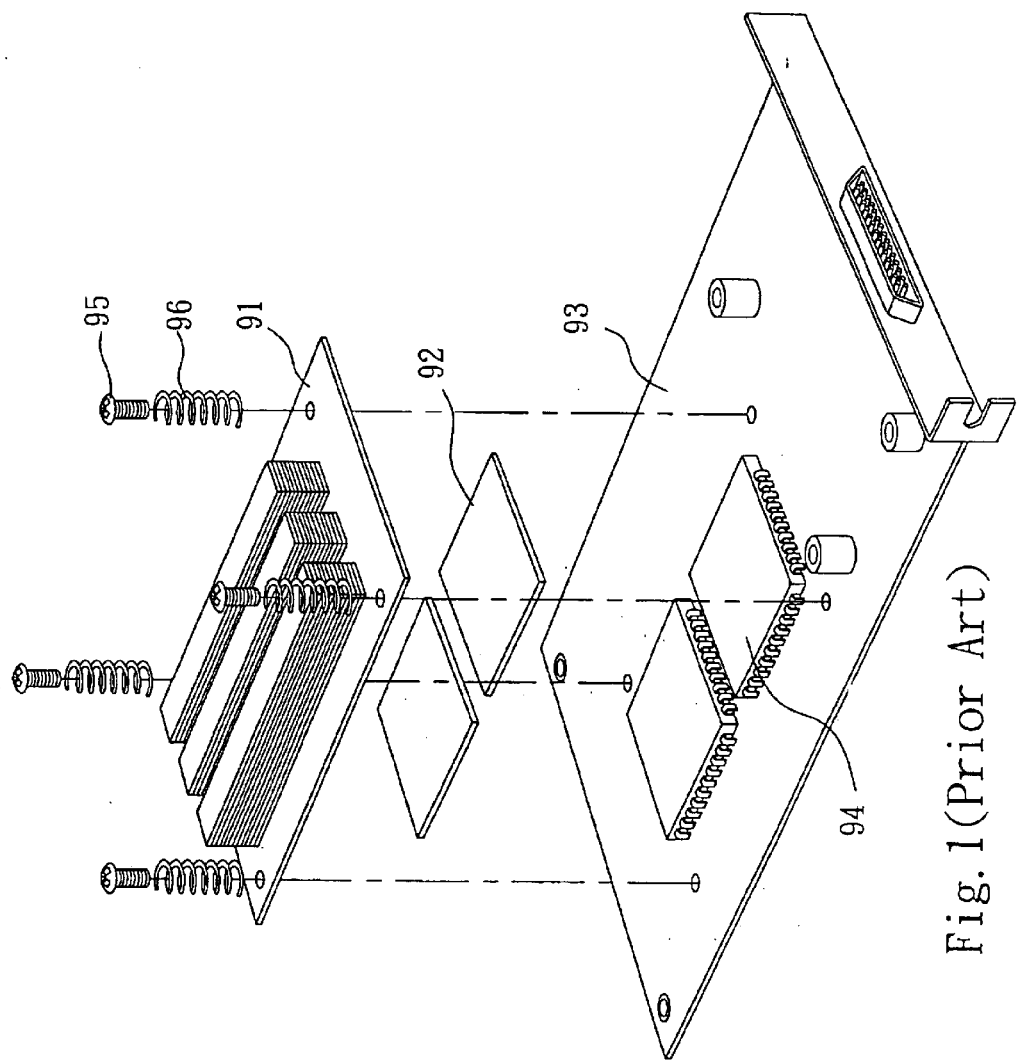
FIG. 1 is an exploded view of a prior art cooling structure.

In addition, the four screws 4 respectively pass through the aperture 12 and each correspond to the tapped hole seats 311 of the radiator board 3, so that the circuit board 1 may be attached onto the radiator board 3. Please refer to FIG. 5. The entire radiator structure is in a flat condition after the locking process. Please refer to FIG. 2. The present invention is clearly much smaller than the prior art cooling fin 91 (refer to FIG. 1). The entire structure of the present invention reduces by about ⅔ the prior art's height, and so can achieve micro miniaturization designs and increase space efficiency without affecting the cooling efficiency.

Please refer to FIG. 5 again. When the circuit board 1 and the radiator board 3 are attached together, the radiator board 3 is pressed close onto the two conductive plates 2 and two microprocessor chips 11. Since the radiator board 3 have the deforming sections 313, a locking force from each tapped hole seat 311 of the radiator board 3 forces each deforming section 313 facing to the circuit board 1 to undergo resilience deformation to absorb a contact pressure generated between the radiator board 3, the conductive plate 2 and the microprocessor chip 11. Therefore, the present invention does not require a spring to absorb the contact pressure, which decreases both the total number of parts number and the manufacturing costs.

Please refer to FIG. 3 again. In this embodiment, there is a plurality of contact points 6. During the attaching process, the plurality of contact points 6 can touch the case to conduct the heat from the radiator board 3. Furthermore, the plurality of contact points 6 can also provide good EMI shielding.

The invention has been described using exemplary preferred embodiments. However, for those skilled in this field the preferred embodiments can be easily adapted and modified to suit additional applications without departing from the spirit and scope of this invention. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

Although the present invention has been explained in relation to its preferred embodiment, it is to be understood that many other possible modifications and variations can be made without departing from the spirit and scope of the invention as hereinafter claimed.

What is claimed is:

1. A radiator structure disposed in a computer device, said radiator structure comprising:

a circuit board comprising at least one exothermal unit installed thereon, and at least two apertures being spaced at a predetermined distances from said at least one exothermal unit;

at least one conductive plate placed above the at least one exothermal unit of said circuit board;

a radiator board comprising at least two lock structures corresponding to the at least two apertures of said circuit board, each lock structure having a deforming section and two long slots, wherein said deforming section being formed between said two long slots, and a lock seat placed on said deforming section; and at least two lock attachments respectively disposed through the at least two apertures of said circuit board and locked onto the lock seat of said radiator board to press said radiator board close onto said at least one conductive plate and said at least one exothermal unit, wherein a locking force from the lock seat of said radiator board causes said deforming section to undergo resilience deformation facing said circuit board to absorb a contact pressure generated between said radiator board, said at least one conductive plate and said at least one exothermal unit.

2. The radiator structure claimed of claim 1 wherein said at least one conductive plate is a copper plate and is adhered to the at least one exothermal unit of said circuit board by a cooling glue layer.

3. The radiator structure claimed of claim 1 wherein said lock seats are tapped hole seats, and said at least two lock attachments are screws each corresponding to said tapped hole seats.

4. The radiator structure claimed of claim 1 wherein said at least one exothermal unit is a microprocessor chip.

5. The radiator structure claimed of claim 1 wherein said radiator board is a metal board with a high thermal conductivity coefficient.

6. The radiator structure claimed of claim 5 wherein said metal board is an aluminum alloy board.

* * * * *